United States Patent [19]

Chen

[11] Patent Number: 5,812,701
[45] Date of Patent: Sep. 22, 1998

[54] VARIABLE LENGTH CODING SYSTEM HAVING A ZIG-ZAG MEMORY

[75] Inventor: Yueh-Chang Chen, Chang-Hua, Taiwan

[73] Assignee: Industrial Technology Research Institute, Hsinchu, Taiwan

[21] Appl. No.: 477,865

[22] Filed: Jun. 7, 1995

Related U.S. Application Data

[62] Division of Ser. No. 163,872, Dec. 8, 1993, Pat. No. 5,479,527.
[51] Int. Cl.⁶ .............................. G06K 9/36; G06K 9/46
[52] U.S. Cl. ..................................... 382/246; 365/230.04
[58] Field of Search ...................... 395/435; 364/DIG. 1, 364/725; 365/189.04, 230.03, 230.04; 382/232–234, 246; 348/384, 390, 419, 420; 358/427, 432, 433, 261.4

[56] References Cited

U.S. PATENT DOCUMENTS

| | | | |
|---|---|---|---|
| 5,247,644 | 9/1993 | Johnson et al. | 358/425 |
| 5,331,417 | 7/1994 | Soohoo | 348/584 |
| 5,333,259 | 7/1994 | Jung | 395/162 |
| 5,341,318 | 8/1994 | Balkanski et al. | 364/725 |
| 5,402,244 | 3/1995 | Kim | 395/261.2 |
| 5,440,713 | 8/1995 | Lin et al. | 395/485 |

*Primary Examiner*—Leo Boudreau
*Assistant Examiner*—Bhavesh Mehta
*Attorney, Agent, or Firm*—Meltzer, Lippe, Goldstein, et. al.

[57] ABSTRACT

A variable length coder is disclosed having a zig-zag memory for continuously receiving blocks of coefficients while outputting the coefficients in zig-zag scan order. The zig-zag memory has a first memory for writing each odd ordinalled block therein according to a zig-zag scan as the odd ordinalled block is inputted. The first memory subsequently reads-out each of the zig-zag scanned odd ordinalled blocks while the zig-zag memory receives each even ordinalled block. The zig-zag memory also has a second memory for writing each even ordinalled block therein according to a zig-zag scan as the even ordinalled block is inputted. The second memory subsequently reads-out each of the zig-zag scanned ordinalled blocks while the zig-zag memory receives each odd ordinalled block. The zig-zag memory further includes a read counter which generates addresses and selectively outputs the addresses to the first memory for reading out each odd ordinalled block, while the zig-zag memory receives an even ordinalled block. The read counter similarly reads out each even ordinalled block, while the zig-zag memory receives an odd ordinalled block. The zig-zag memory additionally has a circuit, responsive to the generated addresses, for outputting a signal indicating whether or not the block coefficient currently read out of the zig-zag memory is a DC coefficient of the block.

5 Claims, 7 Drawing Sheets

FIG. 2
(PRIOR ART)

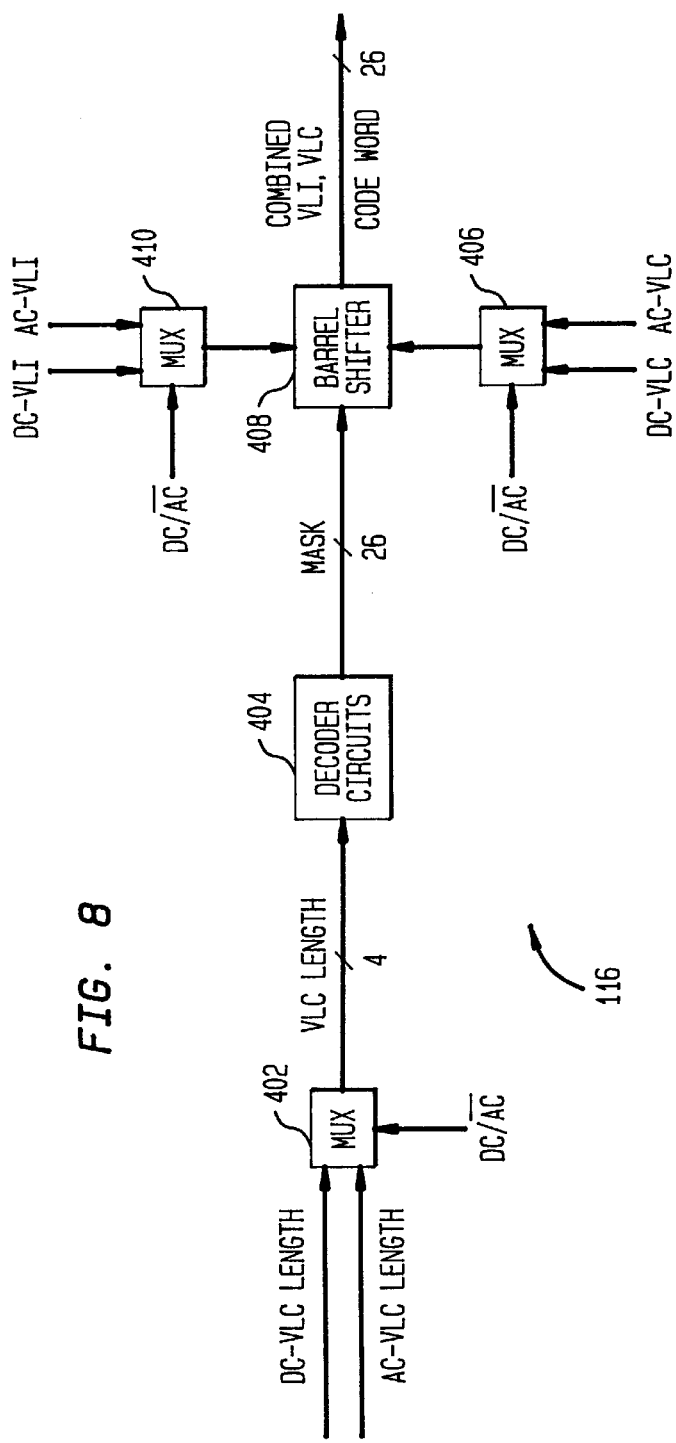
FIG. 8
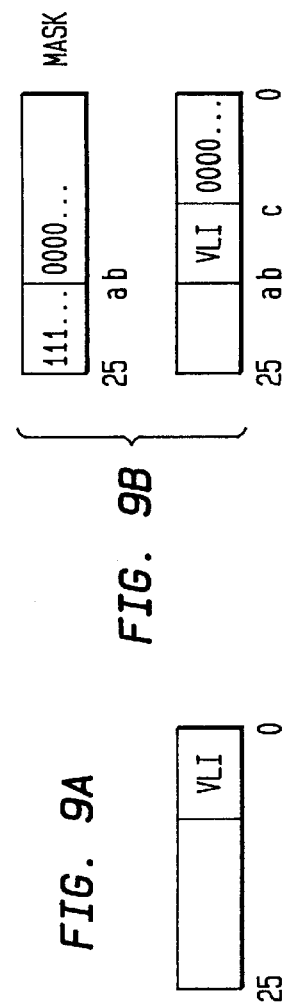
FIG. 9B
FIG. 9A
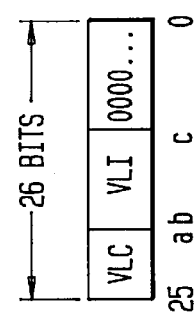
FIG. 9

VARIABLE LENGTH CODING SYSTEM HAVING A ZIG-ZAG MEMORY

This is a division of application Ser. No. 08/163,872, filed Dec. 8, 1993, now U.S. Pat. No. 5,479,527 for VARIABLE LENGTH CODING SYSTEM.

FIELD OF THE INVENTION

The present invention relates to encoding digital images using variable length coders.

BACKGROUND OF THE INVENTION

FIG. 1 shows an illustrative image compression circuit 10 according to JPEG recommendations. A digital image to be compressed is inputted to a discrete cosine transform circuit (DCT) 12 which outputs blocks of DCT transformed coefficients (herein "DCT coefficients" refers to the transformed image data). Illustratively, each block is an eight by eight matrix of DCT coefficients. The DCT coefficient blocks are received at a quantizer 14 which outputs blocks of quantized coefficients.

Each block of quantized coefficients is received at a zig-zag RAM 16. The coefficients are stored in the zig-zag RAM 16 according to a zig-zag scheme such as the zig-zag scheme shown in FIG. 2. To that end, a zig-zag address generator 15 may be provided to cause the coefficients of each block to be stored as in the scheme depicted in FIG. 2. FIG. 3 is a timing diagram illustrating the input and output of the zig-zag RAM 16. As shown, a first block is written into the zig-zag RAM 16 according to a zig-zag scheme during a first time period t=0 to T. Then, the quantized DCT coefficients of the block are sequentially read out, e.g., row by row during a second subsequent time period t=T to 2T. A counter 17 may be provided for generating sequential addresses for sequentially shifting out the quantized DCT coefficients. After the block is shifted out, the zig-zag RAM 16 is prepared to write the next block therein during a third subsequent time period t=2T to 3T.

The quantized DCT coefficients are then variable length encoded using encoder circuits 27. Quantized coefficients can be classified into four types of coefficients: DC coefficients, AC coefficients equal to zero, non-zero AC coefficients with zero run length, and non-zero AC coefficients without zero run length. The encoding of a coefficient depends on its type. In addition, an end of block (EOB) delimiter is inserted after each block which EOB delimiter is processed by the encoder circuits 27.

DC coefficients are received at a differential pulse code modulator (DPCM) 18 which converts each DC coefficient into a variable length integer (VLI). The VLI is inputted to a Huffman encoder 20 which outputs a variable length code word (VLC). The VLI is also inputted to, and stored, in a latch 24. The VLC, when outputted, is stored in a latch 22.

As shown, the AC coefficients are inputted as a VLI to a latch 32 and to a zero run length counter 26. The zero run length counter counts the "zero run length" or total number of AC coefficients equal to zero in a continuous run or subsequence of zeros in the block. Alternatively, if the inputted AC coefficient is not equal to zero, the zero run length counter 26 simply outputs the inputted non-zero AC coefficient. The zero run length (ZRL) or the non-zero AC coefficient are then inputted to a Huffman encoder 28. The Huffman encoder 28 outputs a VLC which is stored in the latch 30.

A multiplexer 34 is provided which selects either the DC-VLI, DC-VLC pair stored in the latches 22 and 24 or the AC-VLI, AC-VLC pair stored in the latches 30 and 32. The multiplexer 34 then outputs the selected VLI,VLC pair in sequence (VLC followed by VLI) to a barrel shifter-FIFO circuit 36. The barred shifter-FIFO circuit 36 then shifts out the VLI-VLC pairs.

Analysis of several images compressed by the circuit 10 reveals the following average number of each type of processing states for the encoder circuits 27 for blocks containing sixty-four coefficients each:

TABLE 1

|  | DC | zero AC | non-zero AC | ZRL | EOB |
|---|---|---|---|---|---|
| count | 1 | 50.24 | 11.78 | 2.11 | 1 |
| cycles | 4 | 2 | 9 | 12 | 4 |

Table 1 also shows the number of cycles used to process a coefficient or EOB delimiter in each state. Thus, the average execution time=1·4+50·2+(12−2)·9+2·12+1·4=222 cycles. Thus, if the circuit 10 is incorporated into an IC chip with a 20 Mhz clock, then 11 frames having a size 512×512×24 bits can be compressed each second.

The architecture of the circuit 10 has three disadvantages:

(1) The zig-zag RAM 16 reduces the band-width of the circuit 10 by ½. This is illustrated in the timing diagram of FIG. 3. Between t=0 and t=T, a first block is written in the zig-zag RAM 16. However, between times t=T and t=2T, the second block is not written in the zig-zag RAM 16. Rather, the first block is read out of the zig-zag RAM 16. The second block is not written into the zig-zag RAM 16 until after t=2T and is not read out until after t=3T. Thus, even though a quantizer 14 can be designed to output a data block every t=T cycles, the data blocks can only be processed by (and outputted from) the zig-zag RAM 16 every t=2T cycles.

(2) A great deal, i.e., almost ½ of the processing time of the encoder circuit 27, is utilized in processing zero coefficients. The processing of zero coefficients delays the processing of non-zero coefficients and therefore reduces the throughput of the circuit 10.

(3) The processing of each non-zero coefficient produces a VLI,VLC pair. The VLI and VLC of each pair must be entered in sequence into the barrel shifter FIFO circuit 36 so that they are adjacent to each other. Typically, the VLI portion is computed much faster than the VLC portion. Thus, the circuit 10 utilizes latches for storing each portion of a pair as it is computed. However, this architecture delays the computation of a subsequent coefficient until the VLI,VLC pair of a preceding coefficient is inputted to the barrel shifter-FIFO circuit 36. Thus, the throughput of the circuit 10 is reduced.

It is therefore an object of the present invention to overcome the disadvantages of the prior art.

SUMMARY OF THE INVENTION

According to one embodiment, an enhanced variable length coder is provided with a ping-pong zig-zag RAM for zig-zag processing a continuous inputted sequence of blocks of coefficients. The ping-pong zig-zag RAM is capable of outputting a continuous sequence of zig-zag scanned blocks without time gaps or delays. The ping-pong zig-zag RAM has a first RAM in which each odd ordinalled block (i.e., first, third, fifth, etc.) of the inputted sequence of blocks is written according to a zig-zag scan as the block is received.

The ping-pong zig-zag RAM also has a second RAM in which each even ordinalled block (i.e., second, fourth, sixth, etc.) of the inputted sequence is written according to a zig-zag scan as the block is received. While an even ordinalled block is written in the second RAM, the first RAM reads out the immediately preceding odd ordinalled block of the received sequence of blocks (which was just written in the first RAM). Likewise, while an odd ordinalled block is written in the first RAM, the second RAM reads out the immediately preceding even ordinalled block of the received sequence of blocks (which was just written in the second RAM).

According to a second embodiment, zig-zag processed blocks are inputted to a zig-zag FIFO prior to encoding. The zig-zag FIFO has a comparator for comparing each coefficient of each zig-zag scanned data block with zero. The zig-zag FIFO also has a counter responsive to the comparator. The counter increments a count therein by one for each received zero AC coefficient of each run, i.e., each continuous subsequence, of zero AC coefficients contained in each block. The zig-zag FIFO also has a FIFO circuit which is responsive to both the comparator and counter. The FIFO stores each DC coefficient and each non-zero AC coefficient of each zig-zag scanned block in the order in which they are received. The FIFO also stores the count of the counter (i.e., the zero run length) for each run of zero AC coefficients in the order in which the run appears in the zig-zag scanned block of coefficients.

According to a third embodiment, the variable length coder includes a variable length integer (VLI), variable length code word (VLC) mixer. The VLI,VLC mixer is illustratively inserted in between the encoder circuits and the barrel shifter-FIFO circuit of a variable length coder circuit. The VLI,VLC mixer has a decoder circuit which receives the length of each VLC outputted by the encoder circuits. In response, the decoder circuit outputs a mask word containing mask bits. The VLI,VLC mixer also includes a barrel shifter. The barrel shifter stores in a shift register therein, the VLI of each VLI,VLC which is outputted by the encoder circuits. In response to receiving the mask word from the decoder circuit, the barrel shifter shifts the VLI to bit positions of the shift register adjacent to bit positions corresponding to mask bits of the received mask word. The barrel shifter then inserts the corresponding VLC (of the VLI,VLC pair outputted by the encoder circuits) into the shift register of the barrel shifter so that the LC is adjacent to the VLI. This combined fixed-length code word (containing the VLI,VLC pair) may then be outputted to a barrel shifter-FIFO which outputs the VLI,VLC pair.

Illustratively, all three embodiments are included in a single variable length coder. Such a variable length coder has the following advantages:

(1) The ping-pong zig-zag RAM doubles the band width of the zig-zag processing.
(2) The zig-zag FIFO predetermines zero run lengths in each block of coefficients prior to encoding thereby decreasing coding processing time by up to 67%.
(3) The VLI,VLC mixer permits fully pipelined operation without increasing the latency of the encoding of DC and AC coefficients.

BRIEF DESCRIPTION OF THE DRAWING

FIG. 2 shows a conventional zig-zag scan.

FIG. 8 shows the VLI,VLC mixer of FIG. 4 in greater detail.

FIGS. 9, 9A and 9B illustrate the operation of the VLI, VLC mixer of FIG. 8.

DETAILED DESCRIPTION OF THE INVENTION

Figure 4:
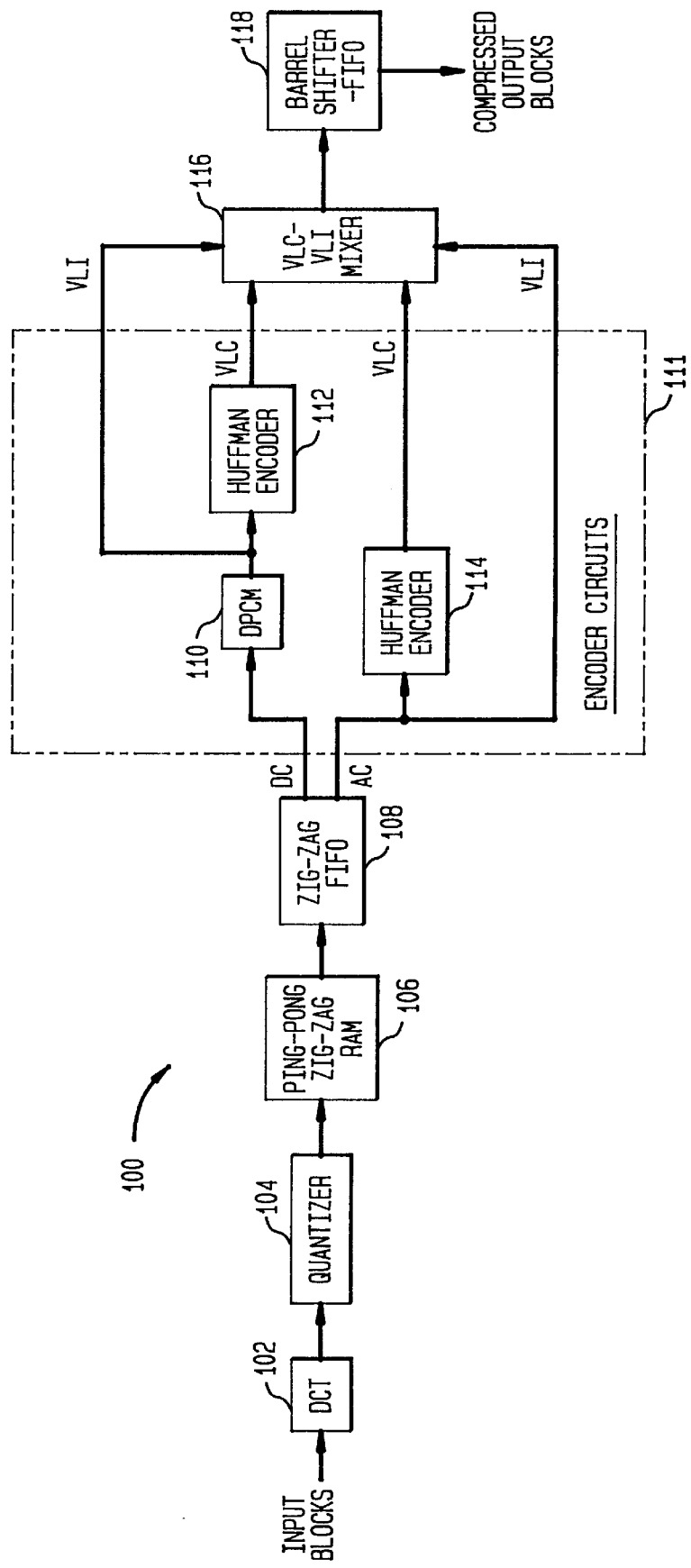
FIG. 4 shows a variable length coder according to one embodiment of the present invention.

FIG. 4 shows a variable length coder 100 according to the present invention. As before, image data blocks are inputted to a DCT circuit 102 which converts the image data blocks to blocks of DCT coefficients. The DCT coefficient blocks are then quantized in a quantizer 104.

Figure 5:
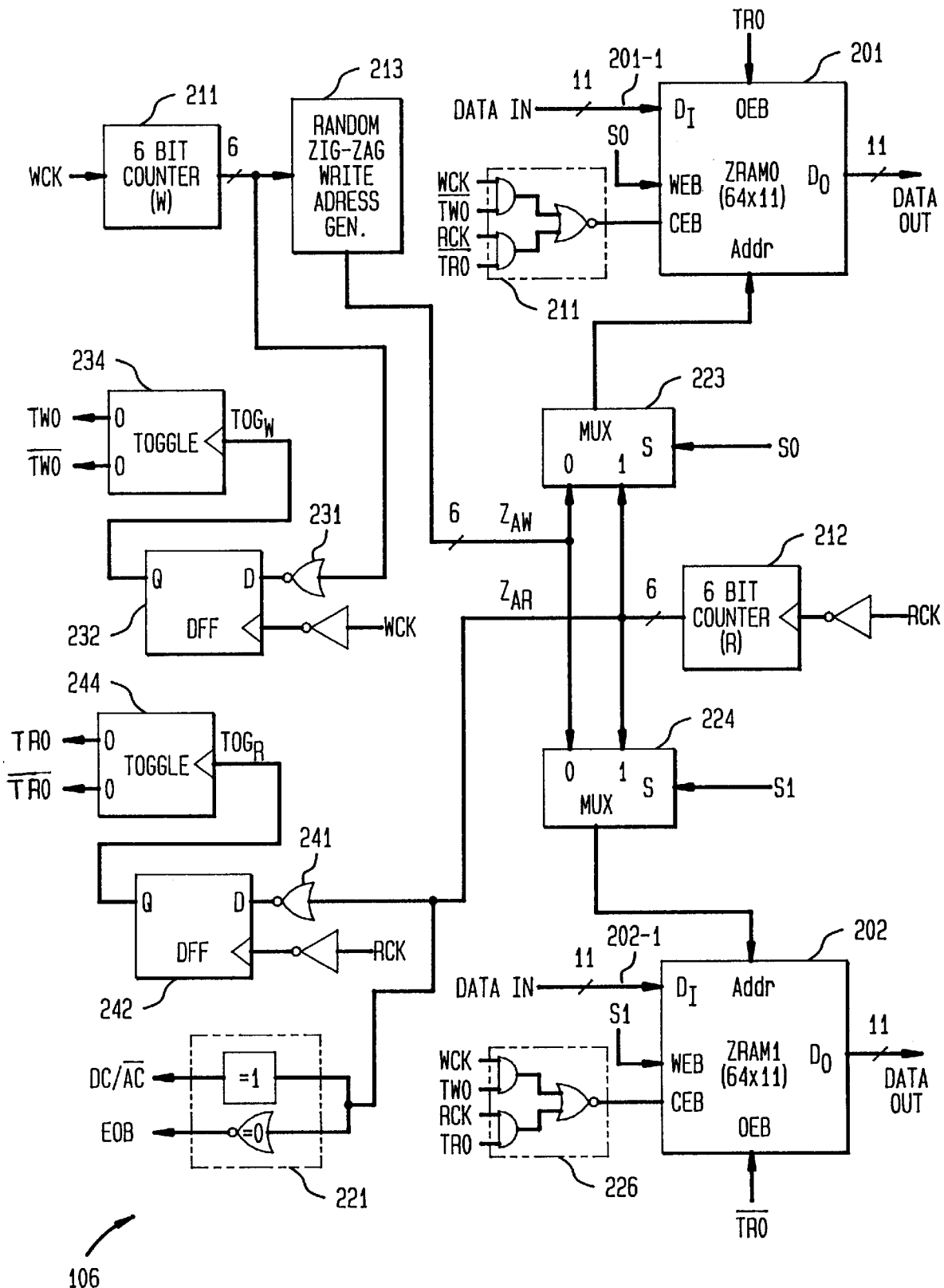
FIG. 5 shows the ping-pong zig-zag RAM of FIG. 4 in greater detail.

The blocks of quantized DCT coefficients are inputted to the ping-pong zig-zag RAM 106. FIG. 5 shows the ping-pong zig-zag RAM 106 in greater detail. The ping-pong zig-zag RAM 106 has two RAMs, ZRAM0 201 and ZRAM1 202, each of which is capable of storing an inputted block of coefficients.

Figure 2:
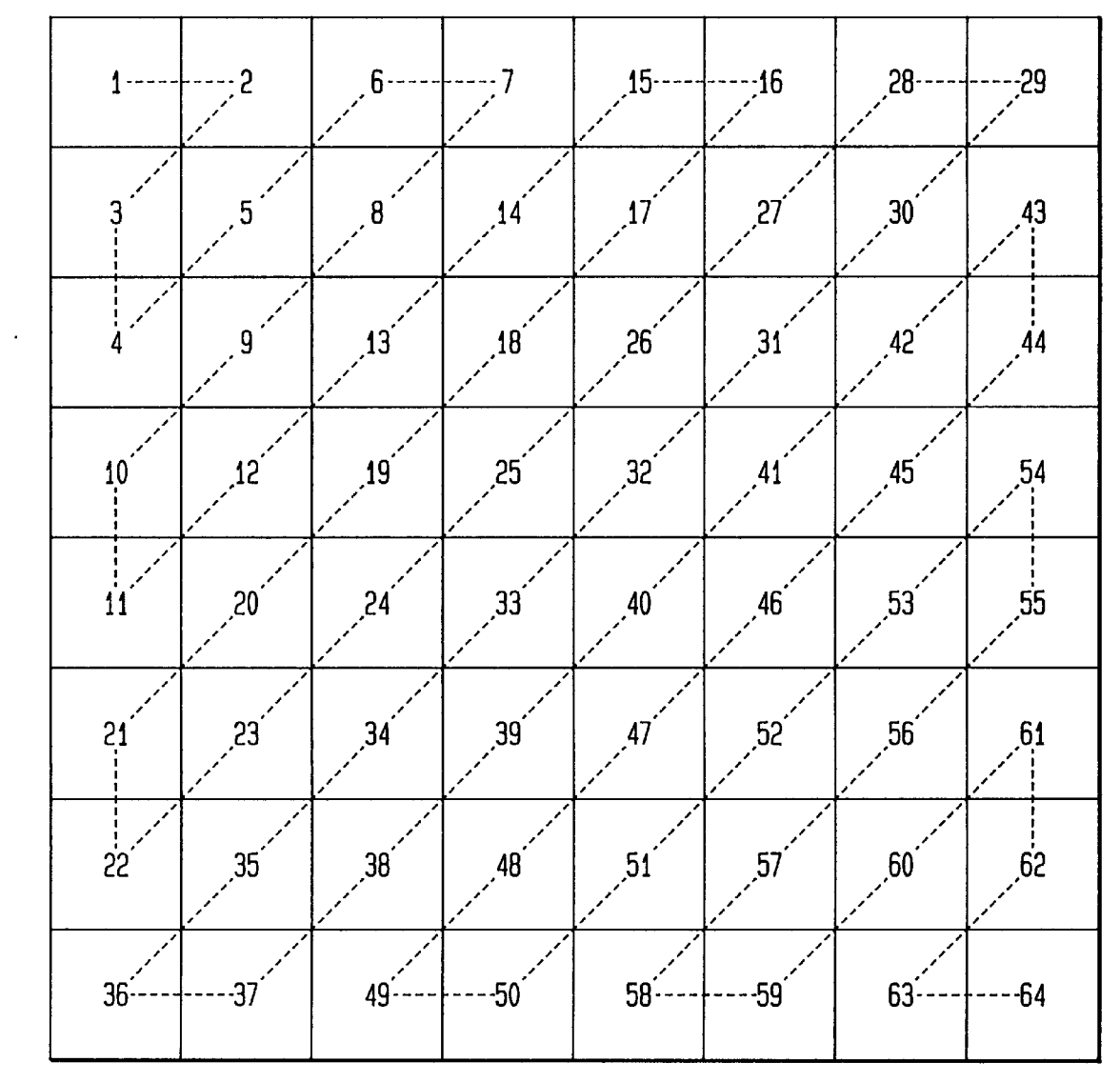

A write address counter 211 is provided which receives a clock WCK. The count of the write address counter 211 is inputted to a zig-zag write address generator 213. The zig-zag write address generator 213 maps the count to a write address ZAW according to a zig-zag scheme, such as is depicted in FIG. 2.

The write count is also inputted to a NOR gate 231, which outputs a logic '1' only when the write count is zero. The logic value outputted by the NOR gate 231 is clocked into a D-flip-flop 232 on a falling edge of the clock WCK. The value outputted from the D flip-flop 232 is inputted to a toggle flip-flop 234. This causes the logic value of the output signal TW0 of the toggle flip-flop 234 to alternate in logic value each time the counter counts through zero, i.e. TW0 alternates in logic value each block.

The ping-pong zig-zag RAM 106 also has a read address counter 212 which receives a clock RCK. The read count of the read address counter 212 is inputted to a NOR gate 241 which outputs a logic '1' when the read count is zero. The logic value outputted by the NOR gate 241 is clocked into a D flip-flop 242 on the falling edge of RCK. The output of the D flip-flop 242 is inputted to a toggle flip-flop 244. The value of the output TR0 alternates every block.

The read count, which is also the read address ZAR, is additionally inputted to a logic circuit 221. The logic circuit 221 determines if the coefficient read out of the ping-pong zig-zag RAM 106 is the DC coefficient (ZAR=1) or an AC coefficient of the block (ZAR>1) or if the end of block is reached (ZAR=0).

The read address ZAR and write address ZAW are both inputted to the multiplexers 223 and 224. The multiplexer 223 receives a select signal S0 and the multiplexer 224 receives the select signal S1 where S1=$\overline{S0}$. The select signals S0 and S1 cause the multiplexer 223 to select ZAR when the multiplexer 224 selects ZAW and to select ZAW when the multiplexer 224 selects ZAR. The address selected by the multiplexer 223 is inputted to an address input terminal of the ZRAM 201. The address selected by the multiplexer 224 is inputted to an address input terminal of the ZRAM1 202.

The select signal S0 is also received at a write enable (WEB) input terminal of the ZRAM0 201. The S0 signal enables the ZRAM0 to write, or prevents the ZRAM0 201 from writing, a coefficient (received from the Data-in line 201-1) at the write address ZAW (received from the address input terminal). Also, the signals WCK, $\overline{\text{TW0}}$, RCK and $\overline{\text{TR0}}$ are inputted to a logic circuit 225. The logic circuit 225 outputs a signal to the chip enable (CEB) input terminal of the ZRAM0 201. An appropriate CEB signal enables the the ZRAM0 201 to write a coefficient (received from the Data-in line 201-1) at the write address ZAW (received from the address input terminal) or read out a coefficient stored in the ZRAM0 201 at the read address ZAR (received at the address input terminal).

Likewise, the ZRAM1 202 receives the signal S1 at the WEB input terminal thereof. The signal S1 enables the ZRAM1 202 to write, or prevents the ZRAM1 202 from writing, a coefficient (received from the Data-in line 202-1) at the write address ZAW (received from the address input terminal). Additionally, the signals, WCK, TW0, RCK and TR0 are inputted to a logic circuit 226. The logic circuit 226 outputs an appropriate signal to a CEB input terminal of the ZRAM1 202 for enabling or disabling the writing of coefficients into or the reading out of coefficients from ZRAM1 202.

The operation of the ping-pong ZRAM 106 is as follows. The coefficients of a sequence of blocks are sequentially inputted e.g., in row-column order) on Data-in lines 201-1 and 202-1. Illustratively, each coefficient has eleven bits.

The WCK and RCK are synchronized with the inputted coefficients so as to cause their respective counters to increment at the same rate data is inputted (or as will be seen below, outputted). The count of the write counter is converted to a zig-zag address ZAW by the zig-zag write address generator 213. The count of the read counter is treated as a read address ZAR.

The ping-pong zig-zag RAM 106 is designed so that ZRAM0 201 and ZRAM1 202 alternately process the blocks of coefficients. For example, suppose the ZRAM0 201 processes each odd ordinalled block (i.e., the first, third, fifth, etc. block) of the sequence of inputted blocks and that the ZRAM1 202 processes each even ordinalled block (i.e., the second, fourth, sixth, etc. block) of the inputted sequences of blocks. Thus, as the coefficients of the first received block are received, the signal S0 is set to a logic '0' thereby causing the multiplexer 223 to select ZAW as the address input to ZRAM0 201. Furthermore, the S0 signal causes the ZRAM0 201 to write the received coefficients of the first block therein (according to a zig-zag scheme).

Invariably, the last coefficient of the first block is received. At this point, the signal S0 changes to a logic '1' thereby disabling the writing of data in the ZRAM0 201. Furthermore, the read and write address counters 211, 212 count through zero thereby changing the value of the signals TW0 and TR0. Thus, the ZRAM0 201 enables the reading out of data therefrom. The changed value of the S0 signal causes the multiplexer 223 to select the sequential read addresses ZAR for input to the address input terminal of the ZRAM0 201. This causes the ZRAM0 201 to sequentially output the zig-zag scanned coefficients of the first block stored therein.

Meanwhile, coefficients of a second block are sequentially inputted on the Data-in lines 201-1 and 202-1. As mentioned above, the changed value of the S0 signal inputted to the WEB input of ZRAM0 201 disables the writing of the second block in the ZRAM0 201. However, the signal S1 is set to a logic '0' and therefore inputs an appropriate WEB value to ZRAM1 202 to enable the writing of the coefficients of the second block in the ZRAM1 202. In addition, the select signal S1 causes the multiplexer 224 to select the zig-zag write addresses ZAW. Thus, while ZRAM 201 sequentially reads out the zig-zag scanned coefficients of the first block, the ZRAM1 202 writes the coefficients of the second block therein according to a zig-zag scan.

Invariably, the last coefficient of the first block is read out of ZRAM0 201 and the last coefficient of the second block is written in ZRAM1 202. At this point, the read counter 212 and the write counter 211 count through zero. This causes the signals TW0 outputted from the toggle flip-flop 234 and TR0 outputted from the toggle-flip-flop 244 to change in value. Likewise, the signal S0 changes back to a logic '0' and the signal S1 changes to a logic '1'. As a result, the ZRAM1 202 sequentially outputs the zig-zag scanned coefficients of the second block stored therein. Meanwhile, the ZRAM0 201 stores the coefficients of a third block (according to a zig-zag scheme) which are inputted on the input line 201-1.

Figure 1:
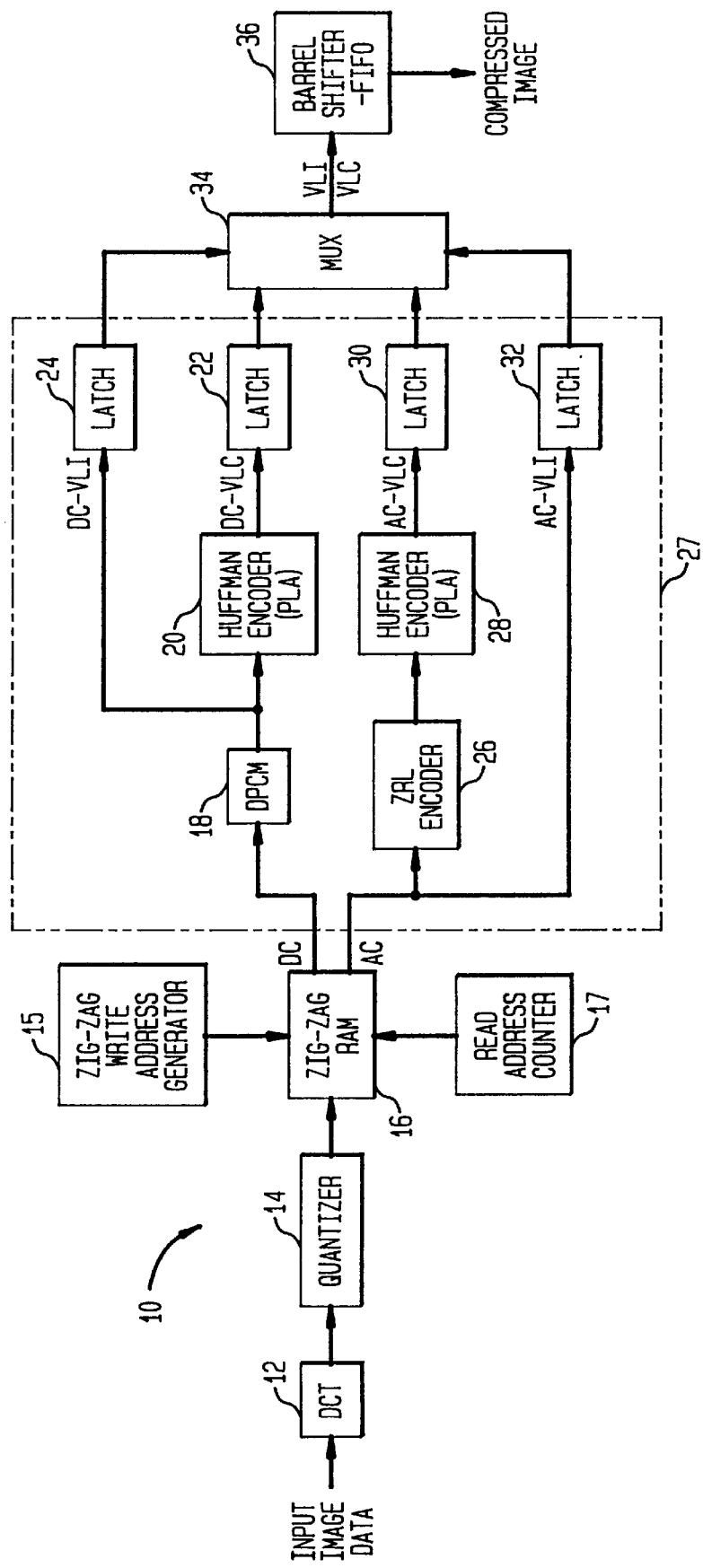
FIG. 1 is a prior art variable length coder-image compression circuit according to JPEG recommendations.
Figure 3:
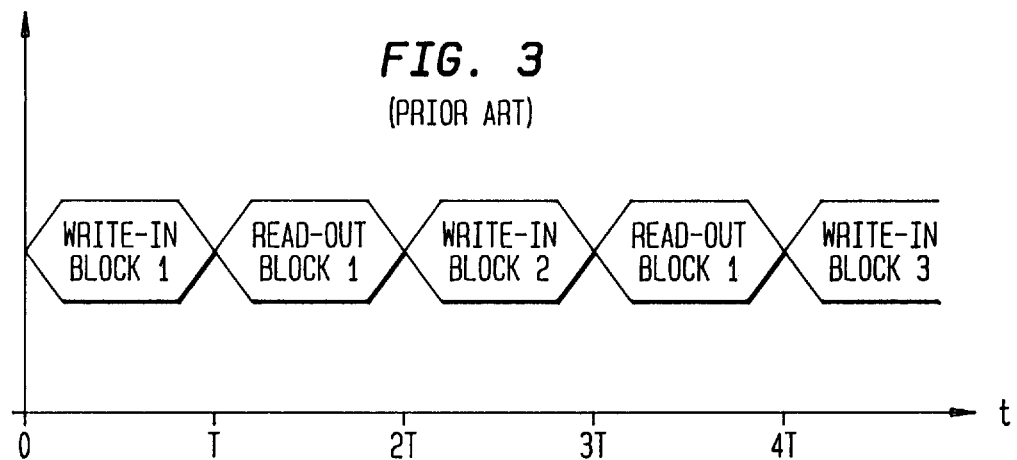
FIG. 3 is a timing diagram illustrating the input and output of a conventional zig-zag RAM.
Figure 6:
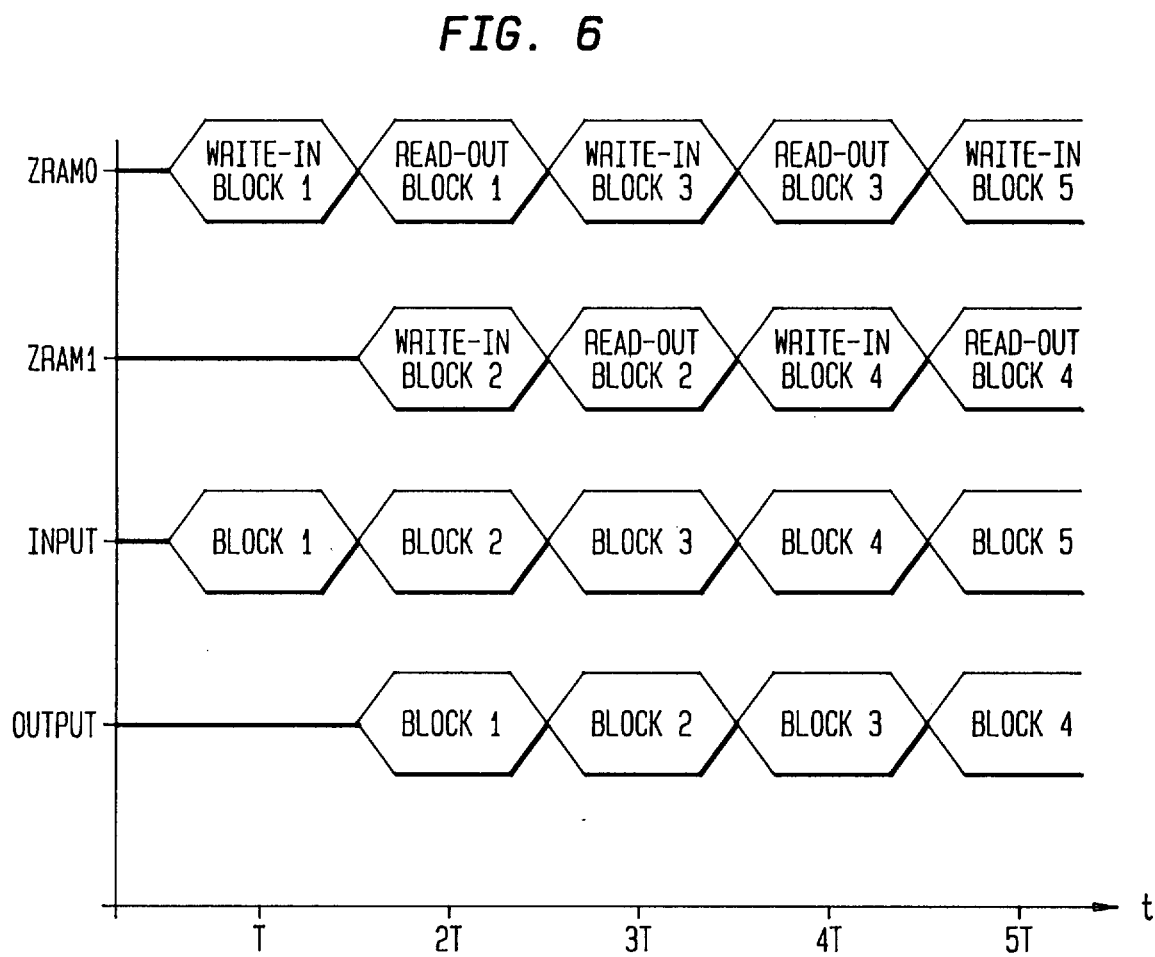
FIG. 6 is a timing diagram illustrating the operation of the ping-pong zig-zag RAM of FIG. 4.

FIG. 6 is a timing diagram illustrating the alternate processing of each block of an inputted sequence of blocks by ZRAM0 201 and ZRAM1 202. As shown, the input and output sequences of blocks are continuous; there are no idle intervals or gaps in between two sequentially inputted or outputted blocks.

Figure 7:
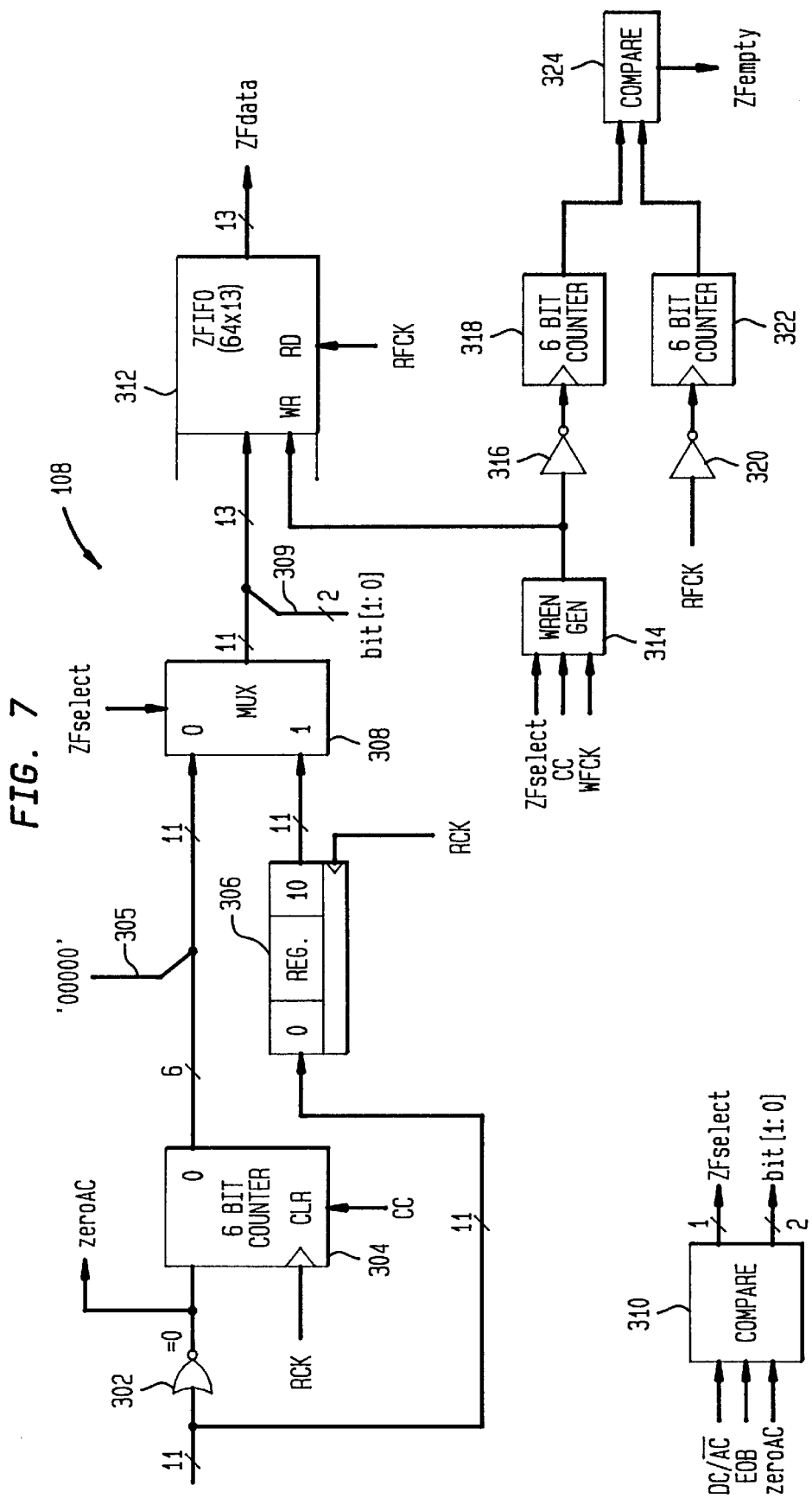
FIG. 7 shows the zig-zag FIFO of FIG. 4 in greater detail.

As shown in FIG. 4, the variable length coder 100 illustratively has a zig-zag FIFO circuit 108 which receives the zig-zag scanned coefficients of each block. FIG. 7 shows an illustrative zig-zag FIFO circuit 108 according to the present invention. The zig-zag scanned coefficients of each block are sequentially received at a comparator circuit 302. The comparator circuit 302 determines whether or not each received coefficient is equal to zero. In response to this comparison, the comparator circuit 302 generates a signal 'zeroAC' which indicates whether or not the received coefficient equals zero.

The zeroAC signal is received at a counter 304. The counter 304 increments a zero run length count therein for every zero AC coefficient of a contiguous sequence of zero AC coefficients in each block. To that end, the counter 304 receives a clear signal 'CC' for resetting the zero run length count upon receiving a nonzero AC coefficient or an EOB value. (Illustratively, the CC signal is received at a synchronous reset or clear terminal of the counter 304). The count of the counter 304 is illustratively a six bit value onto which five more significant logic zero bits '00000' are appended via the lines 305. The eleventh bit value thus computed is inputted to one input of a multiplexer 308.

The coefficients received in the zig-zag FIFO 108 are also inputted to a register 306. The register 306 outputs the received coefficients (delayed by one cycle of the clock RCK) to a second input of the multiplexer 308.

The zig-zag FIFO 108 also has a comparator circuit 310 which receives the DC/$\overline{\text{AC}}$ signal, the EOB signal and the zeroAC signal. In response to these signals, the comparator circuit 310 generates two signals, a two-bit signal called 'bit' which is appended to, and identifies, each processed value outputted by the zig-zag FIFO 108; and a selector signal 'ZFselect' which is inputted to the multiplexer as a selection control signal. The bit and ZFselect signals are generated according to the truth table 2 below:

TABLE 2

| Inputs | | | Outputs | |
|---|---|---|---|---|
| DC/$\overline{AC}$ | EOB | zeroAC | ZFselect | bit |
| 1 | X | X | 1 | 11 (DC) |
| X | 1 | X | 1 | 00 (EOB) |
| 0 | 0 | 0 | 1 | 10 (AC) |
| 0 | 0 | 1 | 0 | 01 (ZRL) |

In Table 2, "X" means "don't care".

The ZFselect signal causes the multiplexer 308 to select the input labeled '0' (the count of the counter 304) whenever a zero AC coefficient is received. Otherwise, if a DC coefficient, EOB delimiter or non-zero AC coefficient is received, the ZFselect signal cause the multiplexer 308 to select the input labeled '1' (the inputted coefficient or EOB delimiter stored in the register 306). (Illustratively, the ZFselect signal is generated at an appropriate time in order to select the corresponding coefficient, delimiter, or zero run length count).

The bit signal is appended via lines 309 to the value selected by the multiplexer 308. This thirteen bit value is inputted to a FIFO "ZFIFO" 312. The ZFIFO 312 has a write enable control input WR which is connected to the output of a write enable generator 314. The write enable generator 314 receives the signals ZFselect, CC, and WFCK. The latter signal WFCK is simply a clock synchronized with the outputting of values from the multiplexer 308. The write enable signal outputted by the write enable generator 314 may be determined from the truth table Table 3 below:

TABLE 3

| Input | | | |
|---|---|---|---|
| WFCK | CC | ZFselect | Output |
| 0, 1 or falling edge | X | X | 0 (write disabled) |
| rising edge | X | 1 | 1 (write enabled) |
| rising edge | 0 | 0 | 0 (write disabled) |
| rising edge | 1 | 0 | 1 (write enabled) |

In other words, when the multiplexer 308 outputs a DC, EOB or nonzero AC value (ZFselect='1') this value may be written in the ZFIFO 312. However, while a run of zeros is being counted in the counter 304 (CC='0', ZFselect='0') such intermediary counts outputted by the multiplexer 308 cannot be stored in the ZFIFO 312. Rather, only after the last zero of a run is counted (at which time the CC signal will be set '1' for clearing the counter 304) is the ZFIFO 312 enabled for storing the count outputted by the multiplexer 308.

The ZFIFO 312 also receives a read clock signal RFCK which causes the ZFIFO 312 to read out the values written therein in the order they were received. RFCK causes the ZFIFO 312 to read out values written therein independently of the writing of values in the ZFIFO 312.

The enable signal outputted by the write enable generator 314 is inverted by the inverter 316 and inputted to the clock input of a write counter 318. The write counter 318 indicates the next storage location of the ZFIFO 312 in which a coefficient or value may be written.

Likewise, the clock pulses of the clock RFCK are inverted by the inverter 320 and inputted to the clock input of a read counter 322. The read counter 322 indicates the next storage location of the ZFIFO 312 from which a coefficient or value may be read.

The counts of the write counter 318 and the read counter 322 are inputted to a comparison circuit 324. The comparison circuit 324 outputs a ZFempty signal when the ZFIFO 312 is empty. Such comparison circuits are well known in the art. For example, the comparison circuit 324 may be designed to indicate that the ZFIFO 312 is empty if a clock pulse of RFCK causes the counts of the read and write counters 318 and 322 to equal one another.

The operation of the zig-zag FIFO circuit 108 is now briefly explained. Suppose the following sequence of values is inputted to the zig-zag FIFO circuit 108: '00000000000', '00000100011', '00000000000', '00000000000', '00000000000', '00000011001' . . . , where the first coefficient is a DC coefficient followed by five AC coefficients. The first coefficient is received at the comparator 302 and the register 306. Because this coefficient is a DC coefficient, the signal DC/$\overline{AC}$=logic '1'. In addition, because the first coefficient is zero, the comparator 302 outputs a zeroAC signal= logic '1'. Furthermore, because there is an inputted coefficient, the end of the block has not yet been reached. Thus, the signal EOB=logic '0'. The zeroAC signal=logic '1', the DC/$\overline{AC}$=logic '1' and the EOB signal=logic '0' are inputted to the comparator circuit 310. In response, the comparator circuit 310 outputs a ZFselect signal=logic '1' and a bit signal=logic '11'. These signals are outputted on the next clock.

On the next clock, the ZFselect=logic '1' causes the multiplexer 308 to select the value stored in the register 306 (the DC coefficient) for output. The bit signal='11' is appended to this coefficient via lines 309. The combination of the DC coefficient and bit signal is inputted to the ZFIFO 312. The ZFselect signal=logic '1' causes the write enable generator 314 to enable the storage of the DC coefficient in the ZFIFO 312.

Meanwhile, the next coefficient '00000100011' is inputted to the comparator 302 which outputs a zeroAC signal= logic '0'. In this case, the signal DC/$\overline{AC}$=logic '0' and the EOB=logic '0'. This coefficient is stored in the register 306. On the next cycle, the comparator circuit 310 outputs a ZFselect signal=logic '1' and a bit signal=logic '10' in response to the inputted signals DC/$\overline{AC}$=logic '0', zeroAC= logic '0' and EOB=logic '0'. Thus, the AC coefficient stored in the register 306 is selected, appended with the bit signal, and stored in the very next location of the ZFIFO 312.

Meanwhile the next AC coefficient '00000000000' is inputted to the logic circuit 302 and stored in the register 306. Again, DC/$\overline{AC}$=logic '0'. In this case, zeroAC=logic '1'. This causes the counter 304 to increment from its initial value of 0 to 1. On the next cycle, the comparator circuit 310 outputs a ZFselect signal=logic '0' and a bit signal equal to logic '01'. While this causes the multiplexer 308 to output the value of the counter 304, the write enable generator 314 does not generate an appropriate write enable signal to store the count in the ZFIFO.

Meanwhile, the next AC coefficient '00000000000' is received at the comparator circuit 302 and stored in the register 306. Again, the counter increments the count therein to 2. However, as before, the write enable generator 314 does not permit the storage of the count in the ZFIFO 312 (because ZFselect=logic '0' and CC=logic '0').

Meanwhile, the next AC coefficient '00000000000' is received. This causes the counter to increment the count therein to 3. On the next cycle, the comparator circuit 310 generates a ZFselect signal='0' which causes the multiplexer to output the count 3. This value is appended to the bit signal '01'.

At the same time, the next AC coefficient '00000011001' is received at the comparator circuit 302. In response, the comparator circuit outputs a zeroAC signal=logic '0'. This, in turn, causes the CC signal to equal logic '1'. (The CC signal=logic '1' clears the counter 304 on the next clock. This is desirable as the non-zero AC coefficient '00000011001' delimits the run of zeros.) As a result, the write enable generator 314 enables the writing of the count=3 (as appended by the bit signal='01') in the ZFIFO 312.

On the next cycle, the comparator circuit outputs a ZFselect signal=logic '1' and a bit signal='10' (because DC/$\overline{AC}$=logic '0', EOB=logic '0' and zeroAC=logic '0'). This causes the multiplexer to output the coefficient '00000011001' stored in the register 306. This coefficient is appended to the bit signal '10' which combination is stored in the ZFIFO 312.

While storing the values in the ZFIFO 312, the values may also be read out. The values are outputted in the order in which they are stored. One value may be outputted per clock of the signal RFCK provided ZFempty does not indicate that the ZFIFO 312 is empty. However, the introduction of the ZFIFO 312 tends to output the values in a continuous stream. Thus, the data may be outputted from the ZFIFO 312 continuously with little or no delay. Table 4 summarizes the processing time for encoder circuits which are fed coefficients, zero run lengths and EOB values by the zig-zag FIFO 108:

TABLE 4

|  | DC | non-zero AC | ZRL | EOB |
|---|---|---|---|---|
| count | 1 | 11.78 | 2.11 | 1 |
| cycles | 4 | 5 | 4 | 4 |

As can be seen, the processing time is reduced to 1·4+12·5+2·4+1·5=81 cycles. Thus, if the variable length coder circuit 100 with zig-zag FIFO 108 was included in a 20 Mhz JPEG image compression IC chip, 30 frames of 512×512×24 bits could be compressed each second.

Returning to FIG. 4, the values (DC coefficients, non-zero AC coefficients, zero run lengths and EOB delimiters) are inputted to encoder circuits 111. The DC coefficients outputted from the zig-zag FIFO 108 are inputted to a DPCM circuit 110 to convert the DC coefficients to variable length integers (VLIs). The DC-VLI's are then inputted to a mixer 116 and to a Huffman encoder 112. The Huffman encoder 112 outputs a variable length code word (VLC) and the length of the VLC to the VLI,VLC mixer 116. The AC coefficients and zero run lengths are inputted as VLI's to the VLI,VLC mixer 116. Furthermore, the AC coefficients and zero run lengths are inputted to a Huffman encoder 114 which outputs a VLC and the length of the VLC to the VLI,VLC mixer 116.

In the circuit 100, the VLI is always computed before the VLC. The VLI and VLC of each VLI,VLC pair must be entered into the barrel shifter-FIFO circuit 118 in sequence, i.e., adjacent to one another. Illustratively, the VLI,VLC mixer 116 achieves this end without increasing latency in the encoder circuits 111.

FIG. 8 shows the VLI,VLC mixer 116 in greater detail. The DC and AC VLC lengths are received in a multiplexer 402. Illustratively, the Huffman encoder 114 (FIG. 4) computes both the VLC and the length of the VLC simultaneously.

The multiplexer 402 receives the DC/$\overline{AC}$ signal. In response, the multiplexer 402 selects the DC-VLC length or AC-VLC length depending on whether the VLC originated from the DC encoder, circuits 110, 112 (FIG. 4) or the AC encoder circuits 114 (FIG. 4). The selected VLC length is inputted to a decoder circuit 404.

The purpose of the decoder circuit 404 is to output an appropriate mask word for combining the VLI and VLC. Illustratively, the VLC can be up to sixteen bits. In order to place the VLC and VLI adjacent to one another, the barrel shifter first places the VLI in a twenty-six bit register justified with the least significant bit side (i.e., the zero bit side of the register) as shown in FIG. 9.

The VLI is then placed adjacent to the VLC starting from the most significant bit not occupied by a bit of the VLC. In order to achieve this end, the decoder circuits 404 generate an appropriate mask word depending on the length of the VLC. Table 4 shows the mask word generated by the decoder circuit 404.

TABLE 5

| VLC length | Mask word |
|---|---|
| 16 | '1111111111111111' |
| 15 | '1111111111111110' |
| 14 | '1111111111111100' |
| 13 | '1111111111111000' |
| 12 | '1111111111110000' |
| 11 | '1111111111100000' |
| 10 | '1111111111000000' |
| 9 | '1111111110000000' |
| 8 | '1111111100000000' |
| 7 | '1111111000000000' |
| 6 | '1111110000000000' |
| 5 | '1111100000000000' |
| 4 | '1111000000000000' |
| 3 | '1110000000000000' |
| 2 | '1100000000000000' |
| 1 | '1000000000000000' |
| 0 | '0000000000000000' |

The mask generated by the decoder circuit 404 is received at a barrel shifter 408. A multiplexer 406 is provided which receives the DC-VLC and AC-VLC values as inputs and the DC/$\overline{AC}$ signal as a selector control input. Another multiplexer 410 is provided which receives the DC-VLI and AC-VLI values as inputs and the DC/$\overline{AC}$ signal as a selector control input. As before, when a DC-VLC or DC-VLI is inputted to the mixer 116, the DC/$\overline{AC}$ signal causes the multiplexers 406, 410 to select the DC-VLC and DC-VLI values, respectively. Likewise, when an AC-VLI or AC-VLC is inputted to the mixer 116, the DC/$\overline{AC}$ signal causes the multiplexers 406, 410 to select the AC-VLC and AC-VLI values, respectively.

The barrel shifter 408 receives the VLI and stores the VLI in a register therein such as is shown in FIG. 9A. When the barrel shifter 408 receives the mask word and VLC, the barrel shifter 408 first left-shifts the VLI to bit positions of the shift register adjacent to bit positions corresponding to mask bits of the mask word. In other words, the VLI is left shifted to bit positions just before the right-most '1' bit of the mask word. This is shown in FIG. 9B. The barrel shifter 408 then inserts the bits of the VLC corresponding to the mask bits, i.e., the '1' bits, of the mask word into the register of the barrel shifter 408 such as is shown in FIG. 9. The combined VLI,VLC code word can then be outputted (in parallel) to the output barrel shifter-FIFO circuit 118.

The operation of the VLI,VLC mixer 116 is now briefly explained. Suppose a DC coefficient is inputted to the DPCM circuit 110, 112 and 114. In such a case, the DC/$\overline{AC}$ signal selects the DC-VLI. Thus, the VLI computed by the DPCM circuit 110 is stored in the barrel shifter register as depicted in FIG. 9A.

The VLI is also inputted to the Huffman encoder 112 (FIG. 4) which outputs a DC-VLC and the length of the outputted DC-VLC. The DC-VLC is inputted to the multiplexer 406. The length of the DC-VLC is inputted to the multiplexer 402. The multiplexer 402 outputs this DC-VLC length because the DC/$\overline{\text{AC}}$ signal indicates that a DC coefficient is processed by the encoder circuits 111. The DC-VLC length is inputted to the decoder circuit 404. The decoder circuit 404 outputs an appropriate mask depending on the inputted VLC length. For instance, suppose the VLC is '11000011' which has a length of eight. In such a case, the decoder circuit 404 outputs the mask '1111111100000000.'

The mask is received in the barrel shifter 408. In response, the barrel shifter left shifts the DC-VLI stored therein seven bits to the right so that the DC-VLI occupies bit positions b:c where c=7 and b=17 (as shown in FIG. 9B). The DC-VLC value is outputted from the multiplexer 406 (because the DC/$\overline{\text{AC}}$ signal indicates that the encoder circuits 111 outputted a DC coefficient). The DC-VLC value is inserted into the most significant eight bit positions 25:a where a=18. The resulting combined code word of bits 25:0 is then outputted to the barrel-shifter. FIFO circuit 118 (FIG. 4). In addition, the total length of the VLC, VLI portion of the combined code word, 25:c may also be outputted. This is possible if the Huffman encoder circuits 112 or 114 (FIG. 4) return the total length of the combined VLI,VLC code word in response to each inputted VLI (in addition to the VLC and VLC length).

By using the VLI,VLC mixer 116, the VLC and VLI may be efficiently placed adjacent to each other. The VLI,VLC mixer 116 achieves this end without increasing the processing latency of the image compression circuit 100 (FIG. 4). In other words, on the clock cycle after receiving the DC-VLC, the mixer can receive a VLI and/or VLC value for the next pair of coefficients.

In short, a variable length coder is disclosed having a ping-pong zig-zag RAM, a zig-zag FIFO and a VLI,VLC mixer or any combination of one or more of these three circuits. The zig-zag RAM has a first RAM for processing each odd ordinalled block of the inputted sequence of blocks and a second RAM for processing each even ordinalled block of the inputted sequence of blocks. The zig-zag FIFO has a comparator circuit, a counter and a FIFO. The comparator circuit is for determining whether or not an inputted coefficient is equal to zero. If the coefficient is non-zero, it is stored in the FIFO. If the coefficient equals zero, the counter increments a count maintained therein. The counter counts the number of zeros in each run or continuous sequence of zero AC coefficients in each block and outputs the count for each sequence of zeros for storage in the FIFO.

The VLI,VLC mixer has a barrel shifter for receiving the VLC and VLI independently of each other and for outputting a combined VLI,VLC code word. The length of the VLC is inputted to a decoder of the mixer. In response to the VLC length, the decoder outputs a particular mask for shifting the VLI to particular bit positions of the barrel shifter register and for inserting the VLC immediately adjacent to the shifted VLI.

Finally, the invention is described above with reference to illustrative embodiments. For instance, all three of the ping-pong zig-zag RAM, zig-zag FIFO and VLI,VLC mixer are advantageously combined into a single circuit. However, any combination of one or more of these three circuits may be included in a variable length coder circuit in order to improve the processing efficiency therein. Furthermore, the invention has been illustrated using a JPEG image compression circuit. The invention is equally applicable to other variable length encoders such as in the H.261 encoder according to MPEG recommendations. Those having ordinary skill in the art may devise numerous other embodiments without departing from the spirit and scope of the following claims.

I claim:

1. A variable length coder comprising:

a zig-zag memory for continuously receiving blocks of coefficients while outputting said coefficients of said blocks in zig-zag scan order, said zig-zag memory comprising:

a first memory for writing each odd ordinalled block therein according to a zig-zag scan as said odd ordinalled block is inputted and for reading-out each of said zig-zag scanned odd ordinalled blocks while said zig-zag memory receives an even ordinalled block, a second memory for writing each even ordinalled block therein according to a zig-zag scan as said even ordinalled block is inputted and for reading-out each of said zig-zag scanned even ordinalled blocks while said zig-zag memory received an odd ordinalled block, a read counter which generates addresses and selectively outputs said addresses to said first memory for reading out each odd ordinalled block while said zig-zag memory receives an even ordinalled block and to said second memory for reading out each even ordinalled block while said zig-zag memory receives an odd ordinalled block, and a circuit responsive to said addresses generated by said read counter, for outputting a signal indicating whether or not said block coefficient currently read out of said zig-zag memory is a DC coefficient of said block, such that the output signal increases the efficiency of said variable length coder.

2. The variable length coder of claim 1 wherein said circuit responds to a particular address, at which the first coefficient of each block is stored in said first or second memory, by indicating that said first coefficient currently being read out of said zig-zag memory is said DC coefficient of said block.

3. The variable length coder of claim 1 wherein said circuit further responds to said addresses generated by said read counter by outputting an indication of whether or not the end of a block of coefficients has been reached.

4. The variable length coder of claim 1 further comprising a zig-zag FIFO which responds to said coefficients and said signal indicating whether or not each coefficient is said DC coefficient of said block, by counting the number of zero amplitude coefficients in a sequence of zero amplitude coefficients, and by refraining from storing the count of said zero amplitude coefficients therein if said signal indicates that said coefficient is said DC coefficient.

5. The variable length coder of claim 4 wherein said zig-zag FIFO stores each of said coefficients at least when said corresponding signal indicates that said coefficient a DC coefficient.

* * * * *